United States Patent [19]

Lee

[11] Patent Number: 4,728,820
[45] Date of Patent: Mar. 1, 1988

[54] LOGIC STATE TRANSITION DETECTION CIRCUIT FOR CMOS DEVICES

[75] Inventor: Jeffrey C. Lee, Palm Bay, Fla.

[73] Assignee: Harris Corporation, Melbourne, Fla.

[21] Appl. No.: 901,841

[22] Filed: Aug. 28, 1986

[51] Int. Cl.$^4$ .................. H03K 17/16; H03K 19/017; H03K 19/096; H03K 5/13

[52] U.S. Cl. ..................................... 307/443; 307/448; 307/452; 307/481; 307/269; 307/594; 307/596; 307/601; 307/603

[58] Field of Search ............... 307/443, 448, 452, 453, 307/481, 269, 594, 596, 601, 603, 605

[56] References Cited

U.S. PATENT DOCUMENTS

| | | | |
|---|---|---|---|
| 4,447,745 | 5/1984 | Takemae et al. | 307/601 |
| 4,594,519 | 5/1986 | Ohtani et al. | 307/481 |

FOREIGN PATENT DOCUMENTS 0114026  6/1985  Japan .................................. 307/269

*Primary Examiner*—John Zazworsky
*Assistant Examiner*—M. R. Wambach
*Attorney, Agent, or Firm*—William A. Troner; Thomas N. Twomey; Charles C. Krawczyk

[57] ABSTRACT

A logic transition detection circuit for detecting logic signal changes. The circuit includes both positive and negative transition detectors for providing a charge at the input of an output stage of the detection circuit when the logic signal changes. A reset circuit is coupled between the output stage and the respective transition detectors for discharging the input of the output stage of the detector, thereby resetting the detector circuit. The output stage resulting provides a pulse denoting that a transition in the logic signal has occurred.

6 Claims, 2 Drawing Figures

LOGIC STATE TRANSITION DETECTION CIRCUIT FOR CMOS DEVICES

BACKGROUND AND SUMMARY OF THE INVENTION

The present invention relates to a logic state transition detector circuit for CMOS devices, and specifically, to detector circuits for detecting address changes in asynchronous CMOS RAM devices for providing timing signals to the internal logic in the memory device.

The sequence of operation for access of an asynchronous RAM begins with address transition detection. The address transition detectors of the prior art typically utilize static pulse generators incorporating an odd number of inverters coupled to NAND or NOR gates for generating an output pulse. The use of NAND or NOR gates, however, require a minimum number of devices to implement the logic at the expense of speed and chip surface area.

It is therefore, an object of the present invention to provide an address transition detector requiring a low number of devices.

It is another object of the present invention to provide an address transition detector requiring less space and having greater speed.

These and other objects of the present invention are obtained by providing an address transition detector (ATD) requiring only 20 devices to implement the necessary logic. The ATD includes two pairs of serially connected P-channel devices connected between a power supply and a common first node. The first pair of transistors detect a positive transition of an address change while the second pair of transistors detect a negative transition of an address change. When detecting a transition, the respective pair of transistors will deposit a charge on the common first node. An inverter is also coupled to the common first node such that its output provides a low output pulse when the common node is charged to a high logic level. However, an additional inverter may be provided at the output such that the output provides a high output pulse in response to an address change if desired.

Also included in the invention is a latching transistor which holds the common first node to a high logic level after being charged to a high state. The node will remain at this level until a reset signal is provided by a delay circuit comprising an odd number of inverters, typically three in number, coupled between the output of the inverter and the gate of an N-channel transistor. The N-channel transistor provides a reset signal to the common node based on the delayed output signal.

By utilizing the combination of this feedback delay with the pairs of P-channel detector transistors, neither NOR or NAND gate are required in the detection circuitry, and thus, a lesser number of devices are required. As a result, less space is required to implement the detector circuit, which may also enhance the speed of the device.

BRIEF DESCRIPTIONS OF THE DRAWINGS

DETAILED DESCRIPTION OF THE INVENTION

Figure 1:
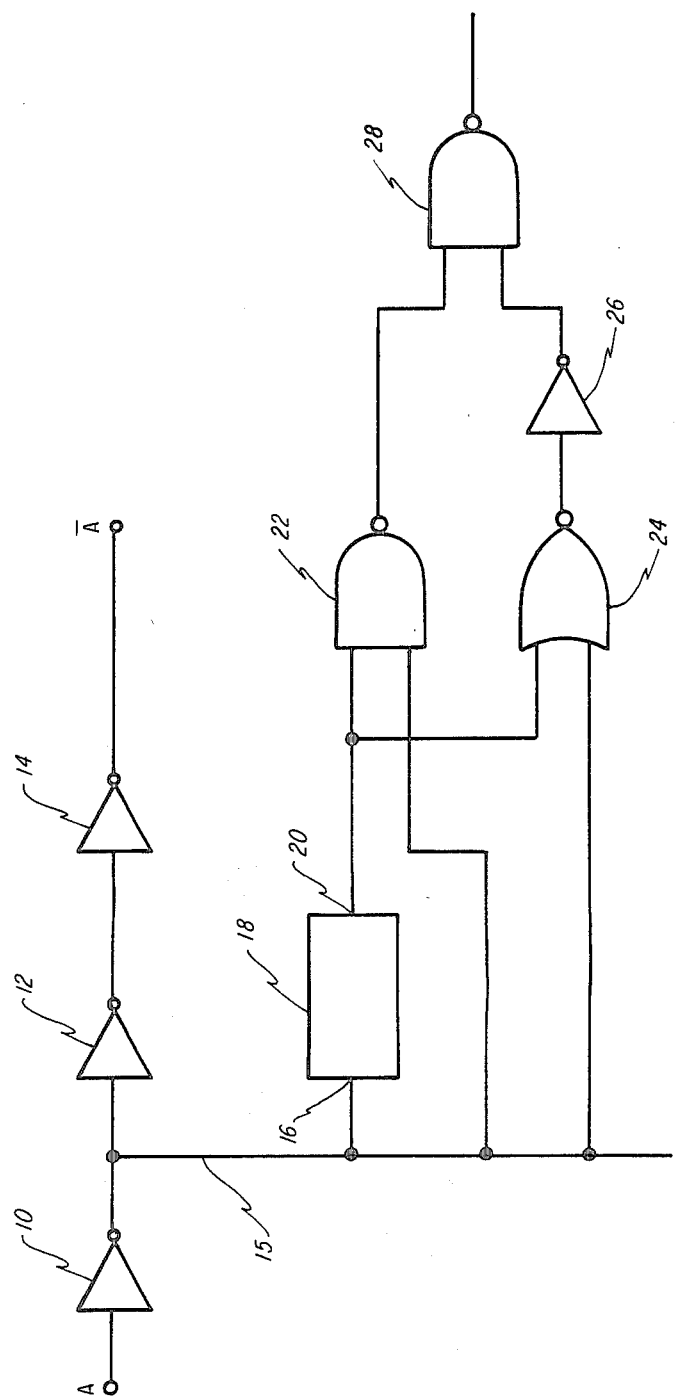
FIG. 1 is a schematic diagram of a prior art detector circuit.

Referring to FIG. 1, an example of the prior art detector is of a static design and includes at its input, three inverters 10, 12, 14 coupled in series having an input portion leading from an external address pin A and an output portion providing a complement of the address signal A. The output signal 15 of the first of the three inverters 10 is coupled to the input 16 of a delay circuit 18 comprising an odd number of series connected inverters. The output 20 of the delay circuit 18 is coupled to the inputs of both a first input of a NAND gate 22 and an NOR gate 24.

The output line 15 of the first inverter 10 is also directly coupled to the second inputs of the first NAND gate 22 and the NOR gate 24. The output of the NOR gate 24 provides the input to a fourth inverter 26. The outputs of both the first NAND gate 22 and the fourth inverter 26 provide the input of a second NAND gate 28 which in turn provides a high timing pulse when the detector has been enabled.

Figure 2:
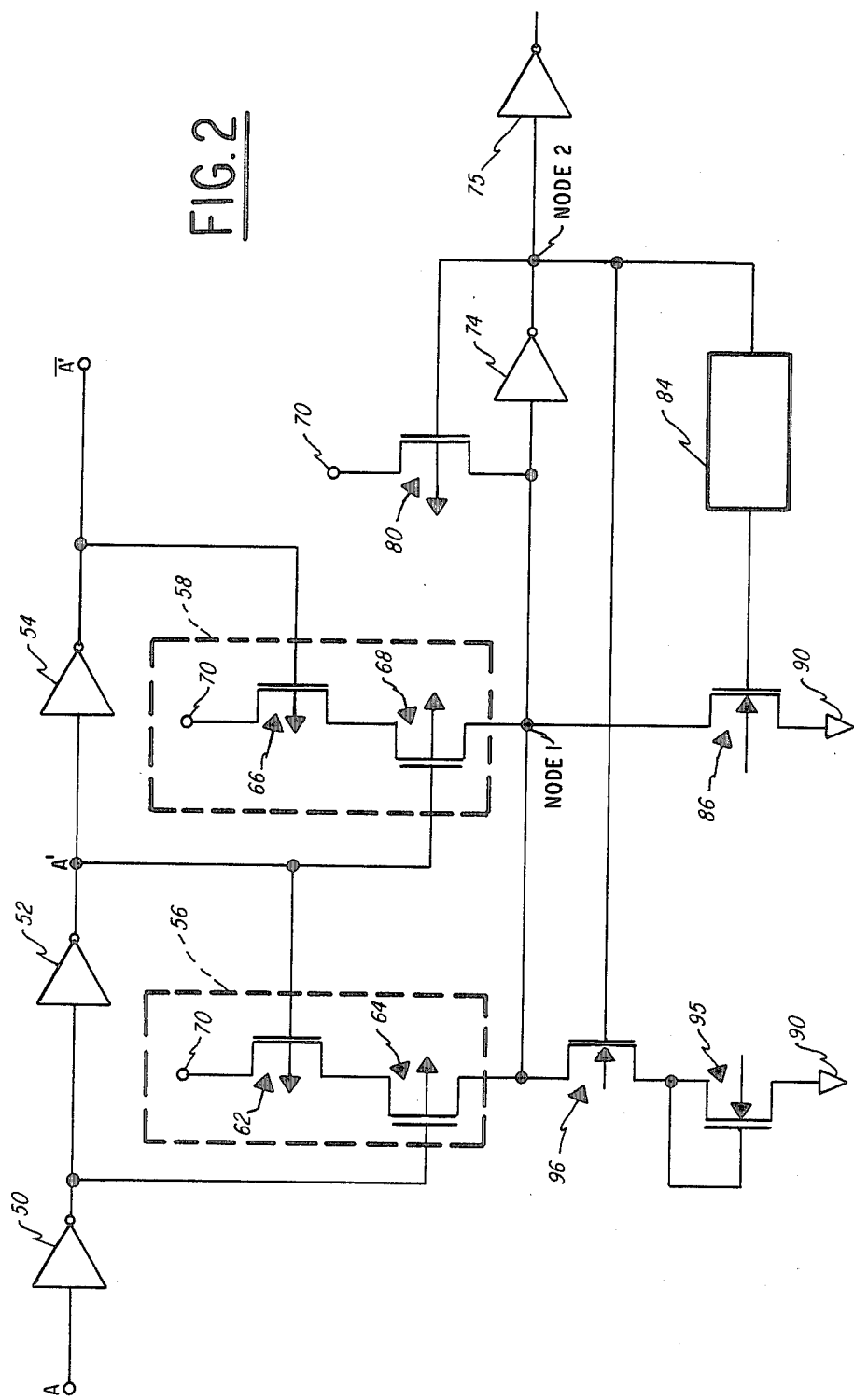
FIG. 2 is a schematic diagram of a preferred embodiment of the present invention.

The present invention as shown in a preferred embodiment in FIG. 2, includes three serially connected inverters 50, 52, 54 similar to that of the prior art. Connected to the inverters are two pairs of serially connected transistors, 56 and 58, which include P-channels 62, 64, 66, and 68. The gates of the P-channels 62 and 68 are both coupled to the output of the second of the inverters 52, while the gates of P-channels 64 and 66 are respectively coupled to the outputs of the first and third inverters 50 and 54. The sources of the P-channels 62 and 66 are coupled to a power supply 70 and the drains of the P-channels 64 and 68 to a common first node. The drain of 62 is coupled to the source of 64, and likewise, the drain of 66 is coupled to the source of 68.

A first output inverter 74 is included for providing a low logic timing pulse. Its input is coupled to the common first node and an output coupled to a second node. Connected to this second node can be a second output inverter 75 should a high logic timing pulse be required. Also coupled to the second node is a latching P-channel transistor 80, with the gate of the P-channel 80 coupled to the second node, the source coupled to the power supply 70 and the drain coupled to the common first node.

The output of the first output inverter 74 is also fed back into a delay circuit 84, the latter comprising an odd number of inverters. The number of inverters provided in the delay circuit 84 is dependent upon the width of the timing pulse desired. The output of the delay circuit 84 is coupled to the gate of a N-channel reset transistor 86. The source of the reset transistor 86 is coupled to the common first node and the drain to a ground potential 90.

A pair of series coupled N-channel transistors 95 and 96 are coupled between the first node and ground potential 90 for providing a leakage current path for the detector circuit. N-channel 96 has its gate connected to the second node at the output so that the leakage circuit path is shut off when one of the P-channel pairs is active as a result of detecting an address change. This results in preventing a power drain through the leakage circuit during detection while still providing a leakage path when the detector is inactive. The second N-channel 95 is designed to have its ratio of width with respect to its length being less than one, thereby providing a high impedance current path.

The present invention generates the internal timing signals for the internal logic of the asynchronous RAM. The address signals are received initially by the first of the series of inverters 50. As the address changes state, a positive transition of the signal is detected by first pair of P-channels 56 and a negative transition by the second pair of P-channels 58 such that when the transition occurs, the first or second pair will conduct respectively to provide a charge onto the common first node. As the charge at the first node increases, the output of the inverter 74 becomes a low output signal. This results in turning on the latching transistor 80, thereby holding the common first node to a high potential until a reset signal is provided by the N-channel 86.

The reset signal is generated as a result of the low output of the second node propagating through the delay circuit 84 comprising an odd number of inverters. The actual number of inverters used in the delay circuit depends upon the width of the detector pulse desired. The output of the delay circuit 84 biases the reset N-channel 86 to an on state after it propagates through the delay circuit. This pulls the common first node low, thereby returning the output at the second node to a high output. An output pulse results having a width corresponding to the number of inverters in the delay circuit 84.

Although the present invention has been described and illustrated in detail, it is to be clearly understood that the same is by way of illustration and example only, and is not to be taken by way of limitation. An example of such is the substitution of P-channels for N-channels and vice versa in the above invention, as well as the substitution of the other types of transistors for those discussed above. Thus, the spirit and scope of the present invention are to be limited only by the terms of the appended claims.

What is claimed is:

1. A logic transistion detector means for detecting logic signal changes, said transition detector means having an input means adapted to receive said logic signals and an output node, said detector means comprising:

an intermediate node having a first logic level;

a first transition detection means having a control terminal means coupled to said input means and an output means coupled to said intermediate node for providing a second logic level at said node when said logic signal changes from a low to a high logic state;

a second transition detection means having a control terminal means coupled to said input means and output means coupled to said intermediate node for providing said second logic level at said node when said logic signal changes from a high to a low logic state;

output means coupled between said intermediate node and said output node for sensing said intermediate node and providing an output signal to said output node when said intermediate node is at a second logic level;

a latching transistor means coupled between a first power supply terminal and said intermediate node, and having a control terminal coupled to said output node for maintaining said intermediate node at said second logic level; and reset means coupled between said output node and said intermediate node for resetting said intermediate node to said first logic level said reset means including a delay circuit, wherein said output signal includes a pulse having a predetermined pulse width.

2. The detector means of claim 1, wherein said reset means further includes a first transistor means coupled between said intermediate node and a second power supply terminal, said delay circuit includes an input coupled to said output node and an output coupled to a control terminal of said first transistor, and wherein said output means is an inverter means.

3. The detector means of claim 2, wherein said delay circuit includes an odd number of serially connected inverter means.

4. The detector means of claim 2, wherein said input means includes a first, second and third inverter means connected in series, said first transition detection means includes a second and third transistor means connected in series between said first power supply terminal and said intermediate node respectively, wherein a control terminal of said second transistor means is coupled to an output of said first inverter means and a control terminal of said third transistor means is coupled to an output of said second inverter means, said second transition detection mean includes a fourth and fifth transistor means coupled between said first terminal of said power supply and said intermediate node respectively, wherein a control terminal of said fourth transistor mean is coupled to an output of said third inverter means and a control terminal of said fifth transistor means is coupled to an output of said second inverter means.

5. The detector means of claim 4, further including a high impedance transistor means coupled between said intermediate node and said second terminal of said power supply for providing a leakage current path when said output node is at said first logic state.

6. A transistion detection circuit for detecting bidirectional transitions of logic signals, said detection circuit comprising:

an input means adapted for receiving said logic signals and providing said logic signals at a first and second node and a complement of said logic signal at a third node;

a positive transition detection means comprising a first and a second P-channel insulated gate field effect transistors, said first transistor having its source connected to a first power supply terminal, its drain to a drain of said second transistor, and its gate to said first node of said input means said second transistor having its source connected to an intermediate node and its gate to said third node of said input means;

a negative transition detection means comprising a third and a fourth P-channel insulated gate field effect transistors, said third transistor having its source connected said first power supply terminal, its drain to a drain of said fourth transistor, and its gate to said second node of such input means, said fourth transistor having its source connected to said intermediate node and its gate to said first node of said input means;

an output inverter means having an input connected to said intermediate node and an output connected to an output node;

a fifth P-channel latching transistor having its source connected to said first power supply terminal, its drain connected to said intermediate node and its gate connected to said output node;

an N-channel relay reset transistor having its source connected to said intermediate node, its drain to a ground potential, and its gate connected to said output node; and a delay circuit comprising and odd number of inverters connected in series having an input connected to said output node and an output connected to said gate of said reset transistor.

* * * * *